United States Patent [19]

Banks et al.

[11] Patent Number: 5,538,766
[45] Date of Patent: Jul. 23, 1996

[54] METHOD FOR RETARDING OXIDATION OF AN ORGANIC SUBSTRATE

[75] Inventors: Bruce A. Banks, Olmsted Township; Sharon K. Rutledge, Bedford, both of Ohio

[73] Assignee: The United States of America as represented by the Administrator of the National Aeronautics & Space Administration, Washington, D.C.

[21] Appl. No.: 65,794

[22] Filed: May 24, 1993

Related U.S. Application Data

[62] Division of Ser. No. 909,345, Jul. 6, 1992, Pat. No. 5,312,685.

[51] Int. Cl.⁶ ...................................................... B05D 3/06
[52] U.S. Cl. ...................... 427/585; 427/250; 427/383.1; 204/192.11; 204/192.14; 204/192.26; 204/192.27; 204/192.28
[58] Field of Search ...................... 427/250, 585, 427/383.1; 204/192.11, 192.14, 192.26, 192.27, 192.28

[56] References Cited

U.S. PATENT DOCUMENTS

| | | | |
|---|---|---|---|
| 3,087,831 | 4/1963 | Browne | 117/35 |
| 3,378,411 | 4/1968 | Bergen | 148/6.35 |
| 3,682,100 | 8/1972 | Lindberg, Jr. | 102/105 |
| 4,560,577 | 12/1985 | Mirtich et al. | 427/38 |
| 4,604,181 | 8/1986 | Mirtich et al. | 204/298 |
| 4,664,980 | 5/1987 | Sovey et al. | 428/421 |
| 4,757,512 | 7/1988 | Macken | 372/59 |
| 4,868,004 | 9/1989 | Zultzke et al. | 427/42 |

OTHER PUBLICATIONS

LDEF Newsletter "Spaceflight Environmental Effects" vol. III No. 1, Mar. 30, 1992, pp. 11–15.

*Primary Examiner*—P. Achutamurthy
*Attorney, Agent, or Firm*—Kent N. Stone

[57] ABSTRACT

Structures composed at least partially of an organic substrate are protected from oxidation by applying a catalyst onto said substrate for promoting the combination of atomic oxygen to molecular oxygen. The structure may also be protected by applying both a catalyst and an atomic oxygen shielding layer onto the substrate. The invention is useful for enhancing the protection of polymeric blankets, solar arrays and spacecraft surfaces in low earth orbit from cavities produced by atomic oxygen.

12 Claims, 4 Drawing Sheets

METHOD FOR RETARDING OXIDATION OF AN ORGANIC SUBSTRATE

ORIGIN OF THE INVENTION

The invention described herein was made by employees of the U.S. Government and may be manufactured and used by or for the U.S. Government without the payment of any royalties thereon or therefore.

STATEMENT OF COPENDENCY

This application is a division of application Ser. No. 909,345 which was filed Jul. 6, 1992 and issued on May 17, 1994 as U.S. Pat. No. 5,312,685.

FIELD OF THE INVENTION

The present invention pertains to protective coatings or shielding layers for retarding oxidation of polymeric and other organic surfaces by atomic oxygen. In particular the invention pertains to coatings and shielding layers used to protect spacecraft surfaces in low earth orbit from developing large oxidized cavities caused by atomic oxygen which may cause structural failure of materials.

BACKGROUND

Atomic oxygen protective coatings typically include $SiO_x$ (where x is between 1.9 and 2.0), fluoropolymer-filled silicon dioxide films, and $Al_2O_3$. These coatings may be deposited as thin films by ion beam sputtering, electron beam evaporation, chemical vapor deposition, RF magnetron deposition, reactive DC magnetron sputter deposition and the like. Protective coatings for atomic oxygen have been applied over polyimides, graphite epoxy, fluorinated ethylene propylene, and various forms of carbon (such as pyrolytic graphite and carbon-carbon composites).

Abrasion and flexure however, of these protective coatings lead to defects which are susceptible to oxidation. In addition, defects occur as a result of particulate contaminants contacting the surface of the organic material; microscopic roughness and undulations on the protective coating surface; and micrometeoroids or other debris which impact on the protective coating in low earth orbit. These defects enable atomic oxygen to react with the underlying organic, polymeric, substrate.

Atomic oxygen gradually undercuts at defect sites in protective coatings thus oxidizing the underlying polymer. A cavity is formed with portions of the protective coating overhanging this cavity.

For typical, spacecraft materials such as polyimide, only about 14% of the incident atomic oxygen will react with the polymer at the bottom of each defect site. Most of the unreacted atomic oxygen that leaves the organic surface is ejected out of the defect opening and back into space. However, as the undercut cavity grows larger around each defect, more and more atomic oxygen, which does not react upon first impact, scatters off the bottom of the atomic oxygen shielding layer. As the atomic oxygen scatters, it again has an opportunity to react with the polymeric material.

U.S. Pat. Nos. 4,560,577, 4,604,181 (Mirtich et al.) and 4,664,980 (Sovey et al.) disclose coating a polymeric substrate with metal oxide to provide protection from oxidation in low earth orbits. Such metal oxide coatings are, however, subject to undercut cavities caused by atomic oxygen.

Protective coatings such as the coating disclosed in the '577, '181 and '980 patents do not recombine atomic oxygen. Consequently, the undercut cavities which inevitably form are continuously exposed to atomic oxygen, which results in a dramatic reduction in the functional lifetime of the underlying structure. Unchecked undercutting ultimately leads to structural failure of protected organic substrates. In the case of solar arrays, this could lead to limiting the duration of the mission or the useful life of the solar array.

U.S. Pat. No. 3,682,100 (Lindberg, Jr.) discloses using a heat-dissociable material for layers which alternate with metal layers in a space vehicle nose cone. The heat dissociable material is selected from hydrides and silver oxide. The outer layer is preferably constructed of ceramic so that upon dissociation of silver oxide, the oxygen does not oxidize the carrier material, but rises to the surface of the nose cone.

U.S. Pat. No. 3,378,411 (Bergen) discloses inhibiting stress corrosion cracking in austenitic stainless steel, particularly upon exposure to chloride, by coating the steel surfaces with an oxide film containing silver, lead and/or cobalt ions.

U.S. Pat. No. 4,757,512 (Macken) discloses silver oxide as a catalyst for oxidizing carbon monoxide to carbon dioxide. There is however, no suggestion of protective coatings for aircraft.

SUMMARY OF THE INVENTION

The present invention protects a structure from oxidation by providing at least one catalyst on a first surface of an organic substrate and at least one atomic oxygen shielding layer.

The present invention protects a structure containing two opposing surfaces from oxidation by providing an atomic oxygen shielding layer on each of said surfaces and a catalyst on each of the atomic oxygen shielding layers. The catalyst is dispersed in at least one atomic oxygen shielding layer or is provided as a discrete layer on at least one of the atomic oxygen shielding layers or alternatively provides for the catalyst to be dispersed in one atomic oxygen shielding layer while it exists as a discrete layer next to the second atomic oxygen shielding layer.

The present invention also protects a polymeric substrate from oxidation by providing an atomic oxygen shielding layer on a catalytic layer coated on said polymer.

The present invention also protects a polymeric substrate from oxidation by applying a first atomic oxygen shielding layer to one surface of the substrate and a second atomic oxygen shielding layer on the second surface of said substrate and providing a catalyst on at least one of the atomic oxygen shielding layers in the form of a dispersion in the shielding layer or a discrete layer.

The present invention further provides a method for retarding oxidation in a atomic oxygen shielding layer protective coating by applying a film of catalytic material on said protective coating, which causes atomic oxygen to combine into diatomic oxygen.

The present invention is also directed to a method for retarding oxidation of an organic substrate in contact with an atomic oxygen shielding layer.

The protective coatings of the present invention retard the growth of undercut cavities produced by atomic oxygen contacting organic surfaces. The protective coatings in accordance with the invention prolong the lifetime of structural surfaces exposed to atomic oxygen by causing atomic oxygen to recombine into diatomic oxygen.

BRIEF DESCRIPTION OF THE DRAWINGS

The invention will be more completely understood by one of ordinary skill in the art with reference to the drawings, wherein.

DETAILED DESCRIPTION OF PREFERRED EMBODIMENTS

The present invention provides for protecting a structure containing an organic substrate, having at least two opposing surfaces, from oxidation. The structure may be constructed of any type of material so long as a portion of the structure contains an organic substrate.

Figure 1:
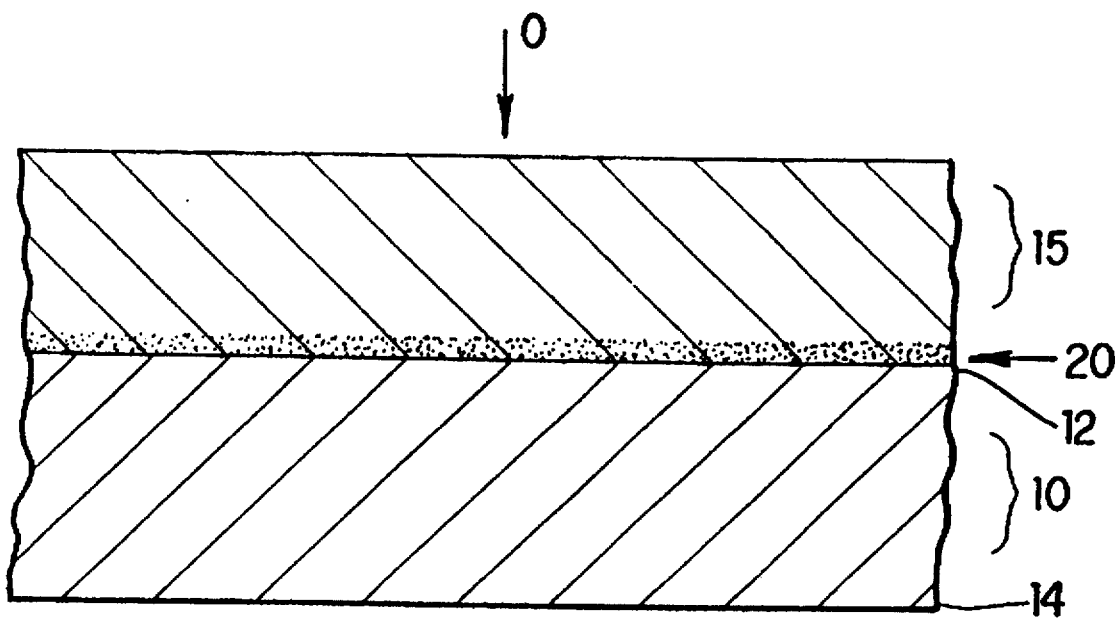
FIG. 1 shows an organic substrate coated successively with a catalyst and an atomic oxygen shielding layer.

Referring to FIG. 1, an oxidation-protected structure comprises an organic substrate 10. The substrate has at least two surfaces 12 and 14, wherein at least one of the surfaces 12 contains a catalyst 20 which promotes combination of atomic oxygen to form molecular oxygen. The organic substrate 10 is comprised of a polymer. Examples of polymers suitable for use as the organic substrate of the present invention include, but are not limited to a polyimide, a fluoropolymer, graphite epoxy or fluorinated ethylene propylene. Fluorinated ethylene propylene is preferred.

Catalysts useful in the present invention for promoting combination of atomic oxygen to form molecular oxygen are comprised of a metal. Examples of metals useful as catalysts in the present invention include but are not limited to silver, hafnium, gold, rhenium, platinum and irridium. Preferably, the catalyst is a precious metal or precious metal oxide. Examples of metal oxide catalysts useful in the present invention include, but are not limited to, silver oxide, hafnium oxide, rhenium oxide and platinum oxide.

According to FIG. 1, the structure of the present invention can further comprise a first atomic oxygen shielding layer 15 on the surface 12 of the organic substrate which contains the catalyst 20. Examples of materials from which first atomic oxygen shielding layer 15 can be comprised include, but are not limited to, aluminum oxide, silicon oxide, magnesium oxide, aluminum, germanium, indium, tin oxide or other metal or metal oxide which is atomic oxygen durable.

The catalyst can be in the form of a layer 20 distinct from the atomic oxygen shielding layer 15 which interfaces with organic substrate 10 as shown in FIG. 1. Alternatively, the catalyst can be dispersed in the organic substrate layer 10 itself or within the atomic oxygen shielding layer 15.

Catalyst layer 20 has a thickness of about 100 Å to about 300 Å. First atomic oxygen shielding layer 15 has a thickness of about 600 Å to about 1 μm, preferably from about 1000 Å to about 1500 Å.

Figure 2:
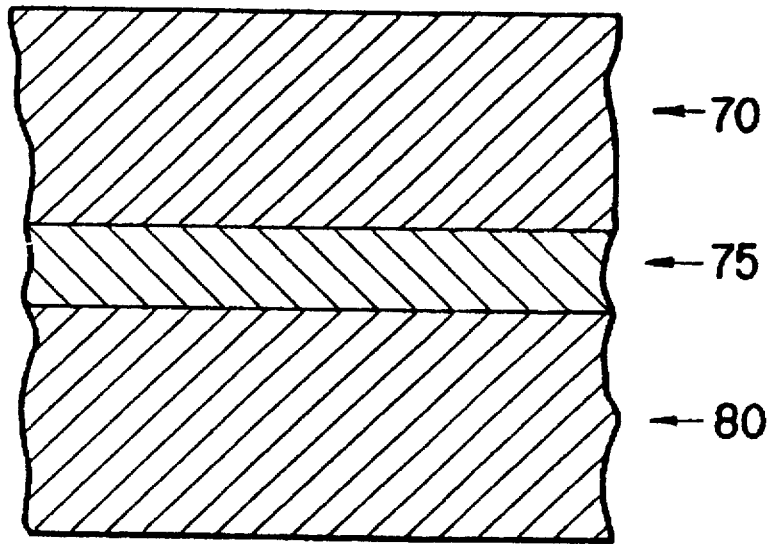
FIG. 2 illustrates a preferred location for the catalyst layer.

FIG. 2 shows a preferred location for the catalyst wherein the catalyst is in the form of a layer 75 distinct from the atomic oxygen shielding layer 70, and which interfaces with substrate 80.

Figure 3:
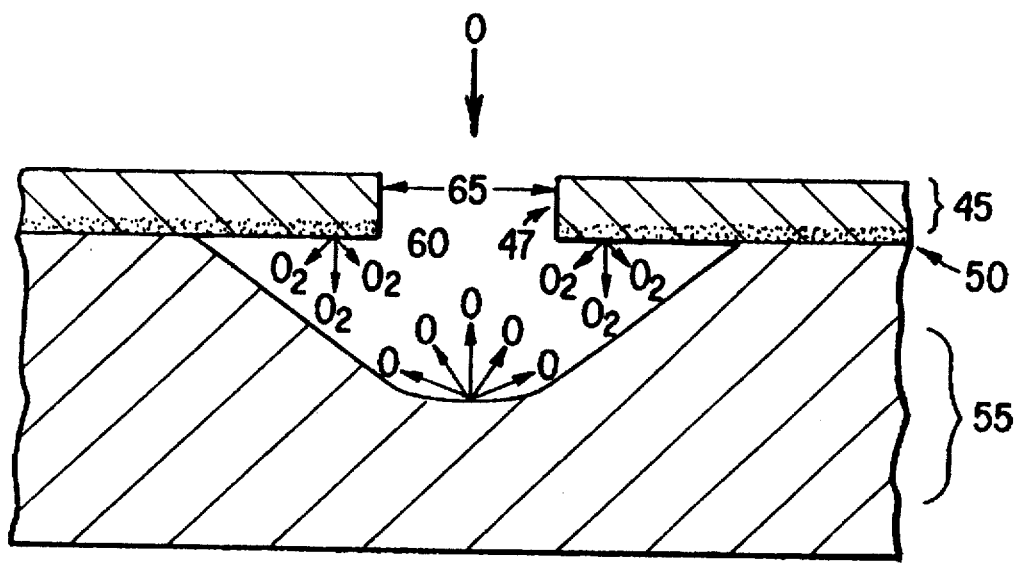
FIG. 3 shows a typical atomic oxygen defect site in a protective coating having a concentration of catalytic material at the protective coating-organic substrate interface.

FIG. 3 illustrates the present invention in accordance with FIG. 1 wherein a defect 65 in the oxygen protective coating 45 has been cut away by atomic oxygen to form undercut cavity 60 and thereby expose a part of the polymer substrate 55. While, atomic oxygen entering into this undercut cavity 60 may initially react with the underlying polymer substrate 55, it can be deflected off the polymer to either exit the undercut cavity 60 through the defect 65 or to contact catalyst layer 50. The atomic oxygen reacts with the catalyst layer 50 on the overhanging portion 47 of the atomic oxygen shielding layer 45. Once the atomic oxygen strikes the concentrated layer of catalyst 50, it reassociates with other atomic oxygen to be ejected from the cavity 60 through defect 65 as diatomic oxygen.

Figure 4:
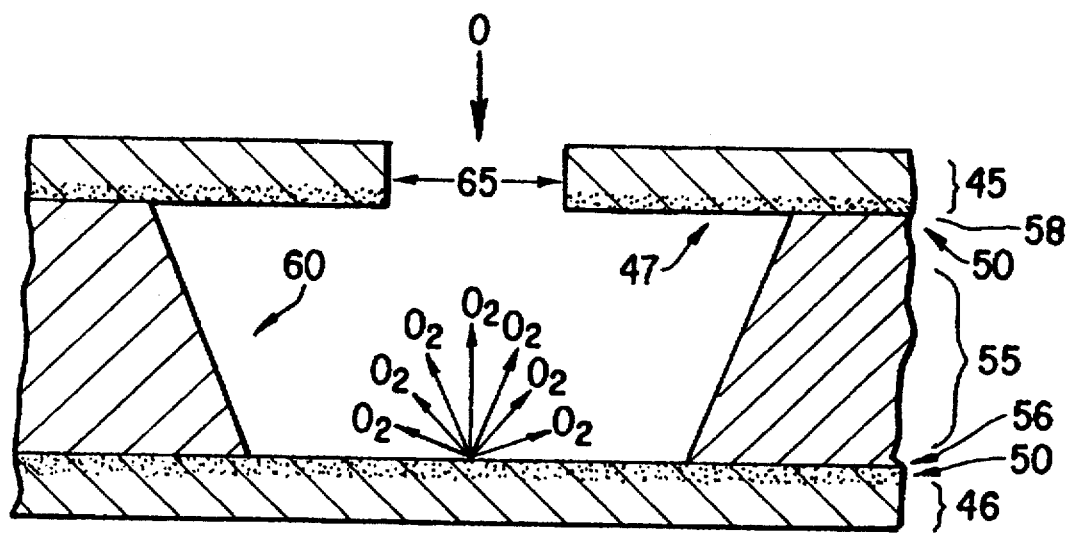
FIG. 4 shows how the growth of an undercut cavity is retarded by applying a protective coating to both sides of a polymeric sheet.

According to FIG. 4, the structure can further comprise a second atomic oxygen shielding layer 46 on a second surface 56 of substrate 55 which contains a catalyst. The catalyst 50 can be applied to opposing sides 56 and 58 of an organic substrate as shown in FIG. 4. The atomic oxygen shielding layers 46 are provided on opposing sides 56 and 58 of an organic substrate 55, and a catalyst layer 50 is disposed between the organic substrate 55 and each atomic oxygen shielding layer. Thus, the catalyst may comprise a layer distinct from the atomic oxygen shielding layers on both opposing surfaces. Alternatively, the catalyst may be dispersed in both atomic oxygen shielding layers. In addition, it is possible to have the catalyst dispersed in the first atomic oxygen shielding layer and in the form of a discrete layer adjacent to the second atomic oxygen shielding layer.

The advantage of having a protective coating on each opposing surface of the organic substrate as illustrated in FIG. 4 is that, after atomic oxygen etches through the first atomic oxygen shielding layer 45, it begins to form an undercut cavity 60 through the organic substrate 55 by etching through the polymer. The catalyst 50 on the second atomic oxygen shielding layer 46 in combination with the catalyst 50 on portions 47 of first atomic oxygen shielding layer 45 which overhang the undercut cavity 60 dramatically increase the probability of diatomic oxygen being formed on first impact within the cavity 60. Here the initial erosion reaction occurs only until the polymer 55 is completely eroded to the second oxygen shielding layer 46. As a result, the growth of the undercut cavity is greatly reduced, thereby extending the functional lifetime of a spacecraft blanket or solar array made of this material.

The second atomic oxygen shielding layer 46 has a thickness of about 600 Å to about 1 μm, preferably from about 1000 Å to about 1500 Å.

Figure 5:
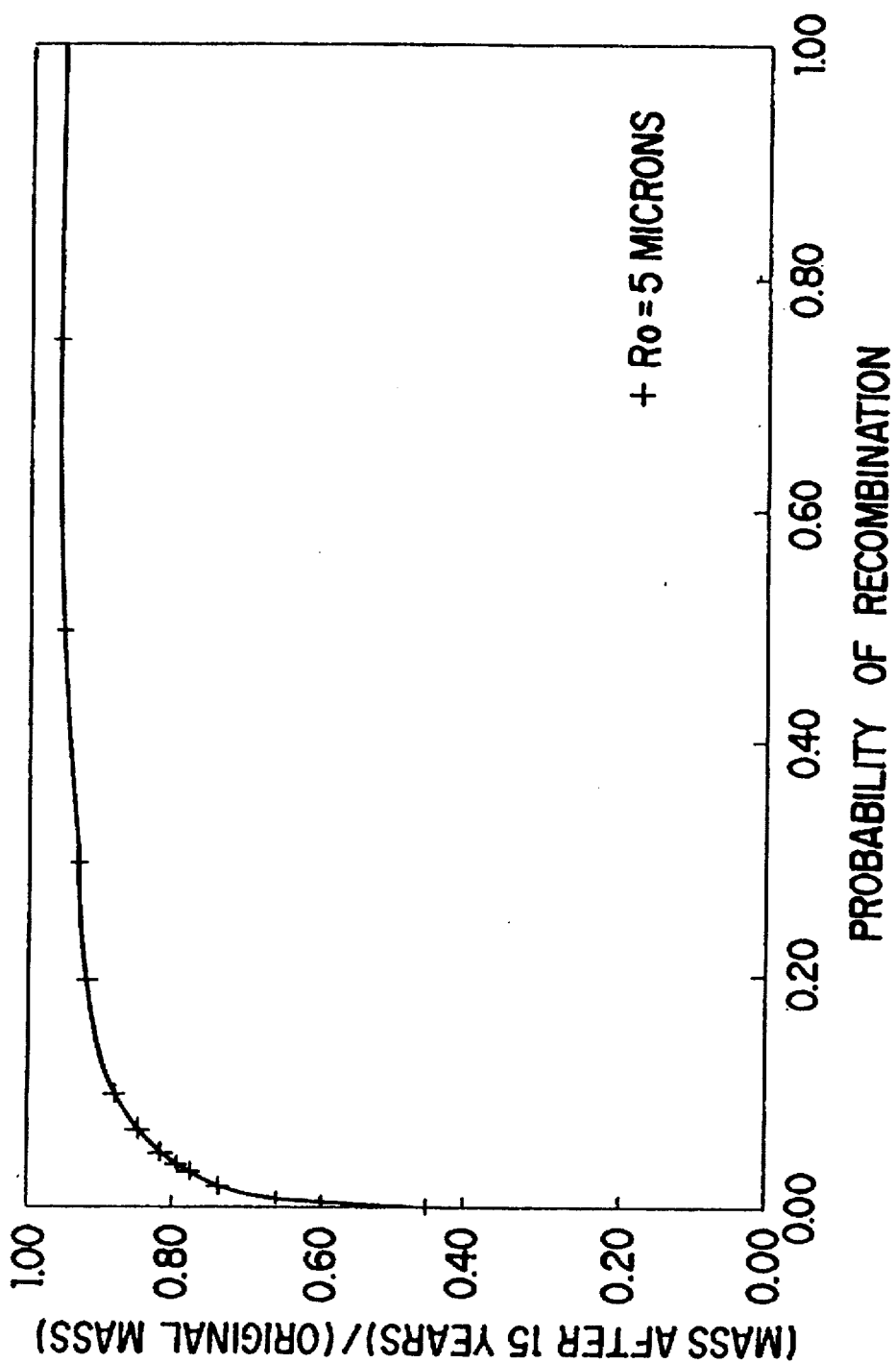
FIG. 5 is a plot of the mass erosion of a polyimide protected by a recombinative coating in accordance with the invention versus atomic oxygen recombination probability.

FIG. 5 illustrates the relationship between erosion and the probability of atomic oxygen recombining to form molecular oxygen. The ordinate (y axis) represents erosion as measured in mass after 15 years in orbit over the original mass before erosion and the abscissa (x axis) represents the probability of oxygen recombination. As shown, a 20% chance of recombination of atomic oxygen to molecular oxygen as for example is seen with the present invention, results in 90% of the mass of the protected structure remaining after 15 years. By contrast, only about 45% of a surface without an oxygen recombination catalyst, will remain over the same period of time.

The present invention also comprises a method for retarding oxidation of an organic substrate having at least two surfaces. The method comprises applying to the substrate a catalyst which causes atomic oxygen to combine into diatomic oxygen upon impact with said catalyst. The organic substrate upon which the catalyst is applied is comprised of a polymer which is preferably a polyimide or a fluoropolymer. The catalyst is a metal preferably selected from the group consisting of silver, hafnium, gold, rhenium, platinum and irridium and is most preferably a metal oxide selected from the group consisting of silver oxide, hafnium oxide, rhenium and platinum oxide.

The method according to the present invention can further comprise the step of applying a first atomic oxygen shielding layer on the surface of the catalyst.

The catalyst is deposited by ion beam sputtering, electron beam evaporation, magnetron sputtering, chemical vapor deposition, reactive sputtering or any combination thereof. The catalyst layer is preferably deposited to a thickness of about 100 Å to about 300 Å.

The first atomic oxygen shielding layer is deposited by ion beam sputtering, electron beam evaporation, magnetron sputtering, chemical vapor deposition, reactive sputtering or any combination thereof. The first atomic oxygen shielding layer is preferably deposited to a thickness of about 100 Å to about 1500 Å.

The method according to the present invention can further comprise adding a second atomic oxygen shielding layer on a second surface of the substrate which contains a catalyst. The second atomic oxygen shielding layer can be deposited to a thickness of about 600 Å to about 1 μm.

Figure 6:
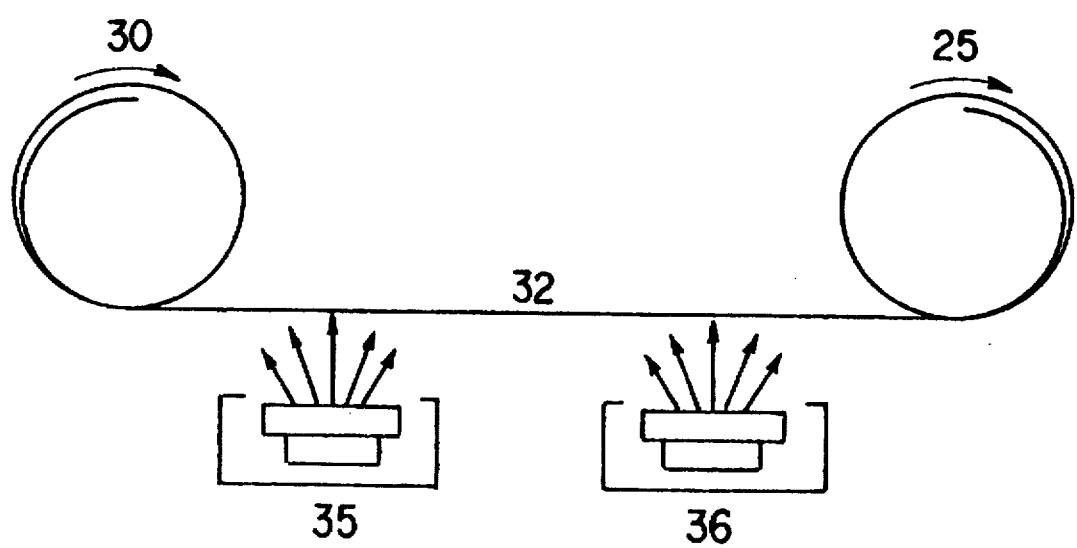
FIG. 6 shows a reel-to-reel coating system which provides a silver oxide interface followed by an $SiO_x$ protective coating, wherein RF magnetron sputter sources are used to apply the protective coating to a sheet material.

FIG. 6 shows a reel-to-reel coating system for applying a catalyst interface and a silicon oxide shielding layer. An example of a typical reel-to-reel coating system is disclosed in U.S. Pat. No. 4,604,181 to Mirtich et al., the disclosure of which is hereby incorporated in its entirety by reference.

According to FIG. 6, two RF magnetron sources 35 and 36 are used-one to deposit the silicon oxide, and one to deposit the catalyst oxide. A single RF magnetron may be used to deposit both the catalyst and the silicon oxide onto the organic sheet 32 which is fed between reels 30 and 25 if the target contains a mixture of silicon oxide and catalysts. When the protective coating is deposited by electron beam evaporation a separate crucible of silver oxide is first evaporated, followed by silicon dioxide or silicon monoxide evaporation.

EXAMPLES

Example 1

A fluorinated ethylene propylene substrate of 0.025 mm to 0.127 mm thickness is coated with hafnium oxide using sputter deposition until the layer is 100 Å to 300 Å thick. Then, a layer of $SiO_2$ is deposited by sputter deposition to a thickness of between 1000 Å–500 Å.

Example 2

The process of Example 1 is used to coat a polyimide substrate using gold as the catalyst layer and $SiO_{1.9-2.0}$ as the thin-film protective coating.

Example 3

Silicon oxide, in which gold is dispersed, is deposited on both sides of a fluorinated ethylene propylene substrate to form a layer of 100 Å to 300 Å thick.

Example 4

Silicon oxide containing gold dispersed therein is deposited on an organic substrate to form a layer of 100 to 300 Å thick. Then a layer of $SiO_2$ is deposited by sputter deposition to a thickness of between 1000 Å to 1500 Å.

Although the present invention has been described in connection with preferred embodiments, it will be apparent to those skilled in the art that numerous modifications and substitutions are possible without departing from the spirit and scope of the invention defined by the following claims.

What is claimed is:

1. A method for retarding oxidation of an organic substrate having at least two outwardly facing surfaces comprising applying to at least one of said surfaces a metal or metal oxide catalyst layer which causes atomic oxygen to be converted into molecular oxygen upon impact with said catalyst, wherein said metal or metal oxide is selected from the group consisting of silver, hafnium, gold, rhenium, platinum, iridium, silver oxide, hafnium oxide, rhenium oxide, and platinum oxide, and applying a first atomic oxygen shielding layer on the surface of said catalyst, and applying a second atomic oxygen shielding layer on a second said surface of said substrate which includes a catalyst layer, capable of promoting conversion of atomic oxygen to molecular oxygen.

2. The method of claim 1 wherein said first atomic oxygen shielding layer is added by ion beam sputtering, electron beam evaporation, magnetron sputtering, chemical vapor deposition, or reactive sputtering or any combination thereof.

3. The method of claim 1 wherein said first atomic oxygen shielding layer is applied simultaneously with said catalyst so that said catalyst is dispersed in said first atomic oxygen shielding layer.

4. The method of claim 1 wherein said catalyst is in the form of a layer distinct from said first atomic oxygen shielding layer.

5. The method of claim 1 wherein said catalyst layer is deposited to a thickness of about 100 Å to about 300 Å.

6. The method of claim 1 wherein said first atomic oxygen shielding layer is added to a thickness of about 600 Å to about 1 μm.

7. The method of claim 1 wherein said second atomic oxygen shielding layer is applied simultaneously with said catalyst so that said catalyst is dispersed in said second atomic oxygen shielding layer.

8. The method of claim 1 wherein said catalyst layer on said second surface is distinct from said second atomic oxygen shielding layer.

9. The method of claim 1 wherein said catalyst is selected from the group consisting of silver, hafnium, gold, rhenium, platinum and irridium.

10. The method of claim 1 wherein said second atomic oxygen shielding layer is added to a thickness of about 600 Å to about 1 μm.

11. The method of claim 1 wherein said catalyst is added by ion beam sputtering, electron beam evaporation, magnetron sputtering, chemical vapor depositionor, reactive sputtering or any combination thereof.

12. The method of claim 1 wherein said second atomic oxygen shielding layer is added by ion beam sputtering, electron beam evaporation, magnetron sputtering, chemical vapor deposition or, reactive sputtering or any combination thereof.

* * * * *